United States Patent
Xu et al.

(10) Patent No.: US 12,508,309 B2
(45) Date of Patent: Dec. 30, 2025

(54) RECOMBINANT VIRAL VECTOR, IMMUNOGENIC COMPOSITION COMPRISING SAME, AND USES

(71) Applicant: VACDIAGN BIOTECHNOLOGY CO., LTD., Jiangsu (CN)

(72) Inventors: Jianqing Xu, Jiangsu (CN); Yang Huang, Jiangsu (CN); Jiahao Sun, Jiangsu (CN)

(73) Assignee: VACDIAGN BIOTECHNOLOGY CO., LTD., Jiangsu (CN)

( * ) Notice: Subject to any disclaimer, the term of this patent is extended or adjusted under 35 U.S.C. 154(b) by 713 days.

(21) Appl. No.: 17/800,637

(22) PCT Filed: Feb. 18, 2020

(86) PCT No.: PCT/CN2020/075677
§ 371 (c)(1),
(2) Date: Aug. 18, 2022

(87) PCT Pub. No.: WO2021/163874
PCT Pub. Date: Aug. 26, 2021

(65) Prior Publication Data
US 2023/0270847 A1   Aug. 31, 2023

(51) Int. Cl.
| | | |
|---|---|---|
| *C12N 15/86* | (2006.01) | |
| *A61K 39/275* | (2006.01) | |
| *A61P 35/00* | (2006.01) | |
| *C07K 14/535* | (2006.01) | |
| *C07K 14/54* | (2006.01) | |
| *A61K 39/00* | (2006.01) | |

(52) U.S. Cl.
CPC ............ *A61K 39/275* (2013.01); *A61P 35/00* (2018.01); *C07K 14/535* (2013.01); *C07K 14/54* (2013.01); *C07K 14/5418* (2013.01); *C07K 14/5443* (2013.01); *C12N 15/86* (2013.01); *A61K 2039/5256* (2013.01); *C12N 2710/24134* (2013.01); *C12N 2710/24143* (2013.01)

(58) Field of Classification Search
CPC ...................................................... C12N 15/86
See application file for complete search history.

(56) References Cited

FOREIGN PATENT DOCUMENTS

| | | |
|---|---|---|
| CN | 103038343 A | 4/2013 |
| EP | 3607965 A1 | 3/2018 |
| JP | 206514549 A | 3/2007 |
| JP | 2013527753 A | 4/2014 |
| JP | 2017511136 A | 4/2017 |
| WO | 2005118788 A2 | 5/2005 |
| WO | 2005118788 A3 | 12/2005 |
| WO | 2014022138 A2 | 2/2014 |
| WO | 2014022138 A3 | 2/2014 |
| WO | 2017209053 A1 | 12/2017 |
| WO | 2020024922 A1 | 2/2020 |

OTHER PUBLICATIONS

Written Opinion of International Searching Authority (Translation) PCT/CN2020/075677 {ISR/CN] dated Nov. 20, 2020.
Notice of Reasons for Refusal (JP 2022-549503) dated Oct. 2, 2023.
Extended European Search Report (EP 20920014.6) dated Oct. 23, 2023.
Decision of Refusal, JP 2022-549503.
Office Action, JP 202080096622.2, dated Mar. 28, 2023.
Office Action, JP 202080096622.2, dated Jun. 9, 2023.

*Primary Examiner* — Prema M Mertz
(74) *Attorney, Agent, or Firm* — Edwin S. Flores; Daniel J. Chalker; Chalker Flores, LLP

(57) ABSTRACT

A recombinant viral vector, an immunogenic composition comprising the same, and uses. The recombinant viral vector comprises a polynucleotide encoding a cytokine, the cytokine being one or more selected from IL-7, IL-15, IL-21 or GM-CSF. The recombinant viral vector is useful in preparing an antitumor vaccine.

9 Claims, 2 Drawing Sheets
Specification includes a Sequence Listing.

SEQUENCE LISTING

<160> NUMBER OF SEQ ID NOS: 16

<210> SEQ ID NO 1
<211> LENGTH: 489
<212> TYPE: DNA
<213> ORGANISM: Artificial Sequence
<220> FEATURE:
<223> OTHER INFORMATION: Synthetic

<400> SEQUENCE: 1

```
atgagaattt cgaaaccaca tttgagaagt atttccatcc agtgctactt gtgtttactt      60
ctaaacagtc attttctaac tgaagctggc attcatgtct tcattttggg ctgtttcagt     120
gcagggcttc ctaaaacaga agccaactgg gtgaatgtaa taagtgattt gaaaaaaatt     180
gaagatctta ttcaatctat gcatattgat gctacttttat atacggaaag tgatgttcac    240
cccagttgca agtaacagc aatgaagtgc tttctcttgg agttacaagt tatttcactt      300
gagtccggag atgcaagtat tcatgataca gtagaaaatc tgatcatcct agcaaacaac    360
agtttgtctt ctaatgggaa tgtaacagaa tctggatgca agaatgtga ggaactggag    420
gaaaaaaata ttaagaatt tttgcagagt tttgtacata ttgtccaaat gttcatcaac    480
acttcttga                                                            489
```

<210> SEQ ID NO 2
<211> LENGTH: 162
<212> TYPE: PRT
<213> ORGANISM: Artificial Sequence
<220> FEATURE:
<223> OTHER INFORMATION: Synthetic

<400> SEQUENCE: 2

```
Met Arg Ile Ser Lys Pro His Leu Arg Ser Ile Ser Ile Gln Cys Tyr
1               5                   10                  15

Leu Cys Leu Leu Leu Asn Ser His Phe Leu Thr Glu Ala Gly Ile His
            20                  25                  30

Val Phe Ile Leu Gly Cys Phe Ser Ala Gly Leu Pro Lys Thr Glu Ala
        35                  40                  45

Asn Trp Val Asn Val Ile Ser Asp Leu Lys Lys Ile Glu Asp Leu Ile
    50                  55                  60

Gln Ser Met His Ile Asp Ala Thr Leu Tyr Thr Glu Ser Asp Val His
65                  70                  75                  80

Pro Ser Cys Lys Val Thr Ala Met Lys Cys Phe Leu Leu Glu Leu Gln
                85                  90                  95

Val Ile Ser Leu Glu Ser Gly Asp Ala Ser Ile His Asp Thr Val Glu
            100                 105                 110

Asn Leu Ile Ile Leu Ala Asn Asn Ser Leu Ser Ser Asn Gly Asn Val
        115                 120                 125

Thr Glu Ser Gly Cys Lys Glu Cys Glu Glu Leu Glu Glu Lys Asn Ile
    130                 135                 140

Lys Glu Phe Leu Gln Ser Phe Val His Ile Val Gln Met Phe Ile Asn
145                 150                 155                 160

Thr Ser
```

<210> SEQ ID NO 3
<211> LENGTH: 435
<212> TYPE: DNA
<213> ORGANISM: Artificial Sequence
<220> FEATURE:
<223> OTHER INFORMATION: Synthetic

<400> SEQUENCE: 3

```
atgtggctgc agagcctgct gctcttgggc actgtggcct gcagcatctc tgcacccgcc        60
cgctcgccca gccccagcac gcagccctgg gagcatgtga atgccatcca ggaggcccgg       120
cgtctcctga acctgagtag agacactgct gctgagatga tgaaacagt agaagtcatc        180 tcagaaatgt ttgacctcca ggagccgacc tgcctacaga cccgcctgga gctgtacaag       240
cagggcctgc ggggcagcct caccaagctc aagggcccct tgaccatgat ggccagccac       300
tacaagcagc actgccctcc aaccccggaa acttcctgtg caacccagat tatcaccttt       360
gaaagtttca agagaaacct gaaggacttt ctgcttgtca tccctttga ctgctgggag        420 ccagtccagg agtga                                                        435
```

<210> SEQ ID NO 4
<211> LENGTH: 144
<212> TYPE: PRT
<213> ORGANISM: Artificial Sequence
<220> FEATURE:
<223> OTHER INFORMATION: Synthetic

<400> SEQUENCE: 4

```
Met Trp Leu Gln Ser Leu Leu Leu Leu Gly Thr Val Ala Cys Ser Ile
1               5                   10                  15

Ser Ala Pro Ala Arg Ser Pro Ser Pro Ser Thr Gln Pro Trp Glu His
            20                  25                  30

Val Asn Ala Ile Gln Glu Ala Arg Arg Leu Leu Asn Leu Ser Arg Asp
        35                  40                  45

Thr Ala Ala Glu Met Asn Glu Thr Val Glu Val Ile Ser Glu Met Phe
    50                  55                  60

Asp Leu Gln Glu Pro Thr Cys Leu Gln Thr Arg Leu Glu Leu Tyr Lys
65                  70                  75                  80

Gln Gly Leu Arg Gly Ser Leu Thr Lys Leu Lys Gly Pro Leu Thr Met
                85                  90                  95

Met Ala Ser His Tyr Lys Gln His Cys Pro Pro Thr Pro Glu Thr Ser
            100                 105                 110

Cys Ala Thr Gln Ile Ile Thr Phe Glu Ser Phe Lys Glu Asn Leu Lys
        115                 120                 125

Asp Phe Leu Leu Val Ile Pro Phe Asp Cys Trp Glu Pro Val Gln Glu
    130                 135                 140
```

<210> SEQ ID NO 5
<211> LENGTH: 534
<212> TYPE: DNA
<213> ORGANISM: Artificial Sequence
<220> FEATURE:
<223> OTHER INFORMATION: Synthetic

<400> SEQUENCE: 5

```
atgttccatg tttcttttag gtatatcttt ggacttcctc ccctgatcct tgttctgttg        60
ccagtagcat catctgattg tgatattgaa ggtaaagatg caaacaata tgagagtgtt        120 ctaatggtca gcatcgatca attattggac agcatgaaag aaattggtag caattgcctg       180
aataatgaat ttaaaccttttt taaaagacat atctgtgatg ctaataagga aggtatgttt       240
ttattccgtg ctgctcgcaa gttgaggcaa tttcttaaaa tgaatagcac tggtgatttt       300
gatctccact tattaaaagt ttcagaaggc acaacaatac tgttgaactg cactggccag       360
gttaaaggaa gaaaaccagc tgccctgggt gaagcccaac caacaaagag tttggaagaa       420
```

```
aataaatctt taaaggaaca gaaaaaactg aatgacttgt gtttcctaaa gagactatta    480
caagagataa aaacttgttg gaataaaatt ttgatgggca ctaaagaaca ctga          534
```

<210> SEQ ID NO 6
<211> LENGTH: 177
<212> TYPE: PRT
<213> ORGANISM: Artificial Sequence
<220> FEATURE:
<223> OTHER INFORMATION: Synthetic

<400> SEQUENCE: 6

```
Met Phe His Val Ser Phe Arg Tyr Ile Phe Gly Leu Pro Pro Leu Ile
1               5                   10                  15

Leu Val Leu Leu Pro Val Ala Ser Ser Asp Cys Asp Ile Glu Gly Lys
            20                  25                  30

Asp Gly Lys Gln Tyr Glu Ser Val Leu Met Val Ser Ile Asp Gln Leu
        35                  40                  45

Leu Asp Ser Met Lys Glu Ile Gly Ser Asn Cys Leu Asn Asn Glu Phe
    50                  55                  60

Asn Phe Phe Lys Arg His Ile Cys Asp Ala Asn Lys Glu Gly Met Phe
65                  70                  75                  80

Leu Phe Arg Ala Ala Arg Lys Leu Arg Gln Phe Leu Lys Met Asn Ser
                85                  90                  95

Thr Gly Asp Phe Asp Leu His Leu Leu Lys Val Ser Glu Gly Thr Thr
            100                 105                 110

Ile Leu Leu Asn Cys Thr Gly Gln Val Lys Gly Arg Lys Pro Ala Ala
        115                 120                 125

Leu Gly Glu Ala Gln Pro Thr Lys Ser Leu Glu Glu Asn Lys Ser Leu
    130                 135                 140

Lys Glu Gln Lys Lys Leu Asn Asp Leu Cys Phe Leu Lys Arg Leu Leu
145                 150                 155                 160

Gln Glu Ile Lys Thr Cys Trp Asn Lys Ile Leu Met Gly Thr Lys Glu
                165                 170                 175

His
```

<210> SEQ ID NO 7
<211> LENGTH: 462
<212> TYPE: DNA
<213> ORGANISM: Artificial Sequence
<220> FEATURE:
<223> OTHER INFORMATION: Synthetic

<400> SEQUENCE: 7

```
atgagatcca gtcctggcaa catggagagg attgtcatct gtctgatggt catcttcttg    60
gggacactgg tccacaaatc aagctcccaa ggtcaagatc gccacatgat tagaatgcgt   120
caacttatag atattgttga tcagctgaaa aattatgtga atgacttggt ccctgaattt   180
ctgccagctc cagaagatgt agagacaaac tgtgagtggt cagcttttc ctgctttcag    240 aaggcccaac taaagtcagc aaatacagga acaatgaaa ggataatcaa tgtatcaatt    300
aaaaagctga gaggaaaacc accttccaca aatgcaggga gaagacagaa acacagacta    360
acatgccctt catgtgattc ttatgagaaa aaaccaccca agaattcct agaaagattc    420 aaatcacttc tccaaaaggt atctaccta agtttcattt ga                       462
```

<210> SEQ ID NO 8
<211> LENGTH: 153

```
<212> TYPE: PRT
<213> ORGANISM: Artificial Sequence
<220> FEATURE:
<223> OTHER INFORMATION: Synthetic

<400> SEQUENCE: 8

Met Arg Ser Ser Pro Gly Asn Met Glu Arg Ile Val Ile Cys Leu Met
1               5                   10                  15

Val Ile Phe Leu Gly Thr Leu Val His Lys Ser Ser Gln Gly Gln
            20                  25                  30

Asp Arg His Met Ile Arg Met Arg Gln Leu Ile Asp Ile Val Asp Gln
                35                  40                  45

Leu Lys Asn Tyr Val Asn Asp Leu Val Pro Glu Phe Leu Pro Ala Pro
        50                  55                  60

Glu Asp Val Glu Thr Asn Cys Glu Trp Ser Ala Phe Ser Cys Phe Gln
65                  70                  75                  80

Lys Ala Gln Leu Lys Ser Ala Asn Thr Gly Asn Asn Glu Arg Ile Ile
                85                  90                  95

Asn Val Ser Ile Lys Lys Leu Lys Arg Lys Pro Pro Ser Thr Asn Ala
                100                 105                 110

Gly Arg Arg Gln Lys His Arg Leu Thr Cys Pro Ser Cys Asp Ser Tyr
            115                 120                 125

Glu Lys Lys Pro Pro Lys Glu Phe Leu Glu Arg Phe Lys Ser Leu Leu
    130                 135                 140

Gln Lys Val Ser Thr Leu Ser Phe Ile
145                 150

<210> SEQ ID NO 9
<211> LENGTH: 66
<212> TYPE: DNA
<213> ORGANISM: Artificial Sequence
<220> FEATURE:
<223> OTHER INFORMATION: Synthetic

<400> SEQUENCE: 9
ggaagcggag ctactaactt cagcctgctg aagcaggctg agacgtgga ggagaaccct      60 ggacct                                                               66

<210> SEQ ID NO 10
<211> LENGTH: 22
<212> TYPE: PRT
<213> ORGANISM: Artificial Sequence
<220> FEATURE:
<223> OTHER INFORMATION: Synthetic

<400> SEQUENCE: 10

Gly Ser Gly Ala Thr Asn Phe Ser Leu Leu Lys Gln Ala Gly Asp Val
1               5                   10                  15

Glu Glu Asn Pro Gly Pro
            20

<210> SEQ ID NO 11
<211> LENGTH: 720
<212> TYPE: DNA
<213> ORGANISM: Artificial Sequence
<220> FEATURE:
<223> OTHER INFORMATION: Synthetic

<400> SEQUENCE: 11
atggtgagca agggcgagga gctgttcacc ggggtggtgc ccatcctggt cgagctggac      60
```

```
ggcgacgtaa acggccacaa gttcagcgtg tccggcgagg gcgagggcga tgccacctac    120
ggcaagctga ccctgaagtt catctgcacc accggcaagc tgcccgtgcc ctggcccacc    180
ctcgtgacca ccctgaccta cggcgtgcag tgcttcagcc gctaccccga ccacatgaag    240
cagcacgact tcttcaagtc cgccatgccc gaaggctacg tccaggagcg caccatcttc    300
ttcaaggacg acggcaacta caagacccgc gccgaggtga agttcgaggg cgacaccctg    360
gtgaaccgca tcgagctgaa gggcatcgac ttcaaggagg acggcaacat cctgggccac    420
aagctggagt acaactacaa cagccacaac gtctatatca tggccgacaa gcagaagaac    480
ggcatcaagg tgaacttcaa gatccgccac aacatcgagg acggcagcgt gcagctcgcc    540
gaccactacc agcagaacac ccccatcggc gacggccccg tgctgctgcc cgacaaccac    600
tacctgagca cccagtccgc cctgagcaaa gaccccaacg agaagcgcga tcacatggtc    660
ctgctggagt tcgtgaccgc cgccgggatc actctcggca tggacgagct gtacaagtaa    720
```

<210> SEQ ID NO 12
<211> LENGTH: 239
<212> TYPE: PRT
<213> ORGANISM: Artificial Sequence
<220> FEATURE:
<223> OTHER INFORMATION: Synthetic

<400> SEQUENCE: 12

```
Met Val Ser Lys Gly Glu Glu Leu Phe Thr Gly Val Val Pro Ile Leu
1               5                   10                  15

Val Glu Leu Asp Gly Asp Val Asn Gly His Lys Phe Ser Val Ser Gly
            20                  25                  30

Glu Gly Glu Gly Asp Ala Thr Tyr Gly Lys Leu Thr Leu Lys Phe Ile
        35                  40                  45

Cys Thr Thr Gly Lys Leu Pro Val Pro Trp Pro Thr Leu Val Thr Thr
    50                  55                  60

Leu Thr Tyr Gly Val Gln Cys Phe Ser Arg Tyr Pro Asp His Met Lys
65                  70                  75                  80

Gln His Asp Phe Phe Lys Ser Ala Met Pro Glu Gly Tyr Val Gln Glu
                85                  90                  95

Arg Thr Ile Phe Phe Lys Asp Asp Gly Asn Tyr Lys Thr Arg Ala Glu
            100                 105                 110

Val Lys Phe Glu Gly Asp Thr Leu Val Asn Arg Ile Glu Leu Lys Gly
        115                 120                 125

Ile Asp Phe Lys Glu Asp Gly Asn Ile Leu Gly His Lys Leu Glu Tyr
    130                 135                 140

Asn Tyr Asn Ser His Asn Val Tyr Ile Met Ala Asp Lys Gln Lys Asn
145                 150                 155                 160

Gly Ile Lys Val Asn Phe Lys Ile Arg His Asn Ile Glu Asp Gly Ser
                165                 170                 175

Val Gln Leu Ala Asp His Tyr Gln Gln Asn Thr Pro Ile Gly Asp Gly
            180                 185                 190

Pro Val Leu Leu Pro Asp Asn His Tyr Leu Ser Thr Gln Ser Ala Leu
        195                 200                 205

Ser Lys Asp Pro Asn Glu Lys Arg Asp His Met Val Leu Leu Glu Phe
    210                 215                 220

Val Thr Ala Ala Gly Ile Thr Leu Gly Met Asp Glu Leu Tyr Lys
225                 230                 235
```

<210> SEQ ID NO 13

<211> LENGTH: 2931
<212> TYPE: DNA
<213> ORGANISM: Artificial Sequence
<220> FEATURE:
<223> OTHER INFORMATION: Synthetic

<400> SEQUENCE: 13

```
atgagaattt cgaaaccaca tttgagaagt atttccatcc agtgctactt gtgtttactt      60
ctaaacagtc attttctaac tgaagctggc attcatgtct tcattttggg ctgtttcagt     120
gcagggcttc ctaaaacaga agccaactgg gtgaatgtaa taagtgattt gaaaaaaatt     180
gaagatctta ttcaatctat gcatattgat gctactttat atacggaaag tgatgttcac     240
cccagttgca agtaacagc aatgaagtgc tttctcttgg agttacaagt tatttcactt      300
gagtccggag atgcaagtat tcatgataca gtagaaaatc tgatcatcct agcaaacaac     360
agtttgtctt ctaatgggaa tgtaacagaa tctggatgca agaatgtga ggaactggag      420
gaaaaaaata ttaaagaatt tttgcagagt tttgtacata ttgtccaaat gttcatcaac     480
acttctggaa gcggagctac taacttcagc ctgctgaagc aggctggaga cgtggaggag     540
aaccctggac ctatgtggct gcagagcctg ctgctcttgg gcactgtggc ctgcagcatc     600
tctgcacccg cccgctcgcc cagccccagc acgcagccct gggagcatgt gaatgccatc     660
caggaggccc ggcgtctcct gaacctgagt agagacactg ctgctgagat gaatgaaaca     720
gtagaagtca tctcagaaat gtttgacctc caggagccga cctgcctaca gaccgcctg      780
gagctgtaca gcagggcct gcggggcagc tcaccaagc tcaagggccc cttgaccatg       840
atggccagcc actacaagca gcactgccct ccaaccccgg aaacttcctg tgcaacccag     900
attatcacct ttgaaagttt caaagagaac ctgaaggact ttctgcttgt catcccttt      960
gactgctggg agccagtcca ggagggaagc ggagctacta acttcagcct gctgaagcag    1020
gctggagacg tggaggagaa ccctggacct gatatcgcgg ccgcgatgtt ccatgtttct    1080
tttaggtata tctttggact tcctcccctg atccttgttc tgttgccagt agcatcatct    1140
gattgtgata ttgaaggtaa agatggcaaa caatatgaga gtgttctaat ggtcagcatc    1200
gatcaattat tggacagcat gaaagaaatt ggtagcaatt gcctgaataa tgaatttaac    1260
ttttttaaaa gacatatctg tgatgctaat aaggaaggta tgttttatt ccgtgctgct    1320
cgcaagttga ggcaatttct taaaatgaat agcactggtg attttgatct ccacttatta    1380
aaagtttcag aaggcacaac aatactgttg aactgcactg gccaggttaa aggaagaaaa    1440
ccagctgccc tgggtgaagc ccaaccaaca aagagtttgg aagaaaataa atcttttaaag    1500
gaacagaaaa aactgaatga cttgtgtttc ctaaagagac tattacaaga gataaaaact    1560
tgttggaata aaattttgat gggcactaaa gaacacggaa gcggagctac taacttcagc    1620
ctgctgaagc aggctggaga cgtggaggag aaccctggac ctatgagatc cagtcctggc    1680
aacatggaga ggattgtcat ctgtctgatg gtcatcttct ggggacact ggtccacaaa    1740
tcaagctccc aaggtcaaga tcgccacatg attagaatgc gtcaacttat agatattgtt    1800
gatcagctga aaaattatgt gaatgacttg gtccctgaat tctgccagc tccagaagat    1860
gtagagacaa actgtgagtg gtcagctttt tcctgctttc agaaggccca actaaagtca    1920
gcaaatacag gaaacaatga aggataatc aatgtatcaa ttaaaaagct gaagaggaaa    1980
ccaccttcca caaatgcagg gagaagacag aaacacagac taacatgccc ttcatgtgat    2040
tcttatgaga aaaaccacc caaagaattc ctagaaagat caaatcact tctccaaaag    2100
gtatctacct taagtttcat tccatgggat atcggaagcg gagctactaa cttcagcctg    2160
```

```
ctgaagcagg ctggagacgt ggaggagaac cctggacctg aattcgagct catggtgagc    2220
aagggcgagg agctgttcac cggggtggtg cccatcctgg tcgagctgga cggcgacgta    2280
aacggccaca agttcagcgt gtccggcgag ggcgagggcg atgccaccta cggcaagctg    2340
accctgaagt tcatctgcac caccggcaag ctgcccgtgc cctggcccac cctcgtgacc    2400
accctgacct acggcgtgca gtgcttcagc cgctacccccg accacatgaa gcagcacgac    2460
```

```
ttcttcaagt ccgccatgcc cgaaggctac gtccaggagc gcaccatctt cttcaaggac    2520
gacggcaact acaagacccg cgccgaggtg aagttcgagg gcgacaccct ggtgaaccgc    2580
atcgagctga agggcatcga cttcaaggag gacggcaaca tcctggggca caagctggag    2640
tacaactaca acagccacaa cgtctatatc atggccgaca gcagaagaa cggcatcaag    2700 gtgaacttca gatccgcca caacatcgag gacggcagcg tgcagctcgc cgaccactac    2760
cagcagaaca cccccatcgg cgacggcccc gtgctgctgc ccgacaacca ctacctgagc    2820
acccagtccg ccctgagcaa agaccccaac gagaagcgcg atcacatggt cctgctggag    2880
ttcgtgaccg ccgccgggat cactctcggc atggacgagc tgtacaagta a              2931
```

<210> SEQ ID NO 14
<211> LENGTH: 976
<212> TYPE: PRT
<213> ORGANISM: Artificial Sequence
<220> FEATURE:
<223> OTHER INFORMATION: Synthetic

<400> SEQUENCE: 14

```
Met Arg Ile Ser Lys Pro His Leu Arg Ser Ile Ser Ile Gln Cys Tyr
 1               5                  10                  15

Leu Cys Leu Leu Leu Asn Ser His Phe Leu Thr Glu Ala Gly Ile His
                20                  25                  30

Val Phe Ile Leu Gly Cys Phe Ser Ala Gly Leu Pro Lys Thr Glu Ala
            35                  40                  45

Asn Trp Val Asn Val Ile Ser Asp Leu Lys Lys Ile Glu Asp Leu Ile
        50                  55                  60

Gln Ser Met His Ile Asp Ala Thr Leu Tyr Thr Glu Ser Asp Val His
65                  70                  75                  80

Pro Ser Cys Lys Val Thr Ala Met Lys Cys Phe Leu Leu Glu Leu Gln
                85                  90                  95

Val Ile Ser Leu Glu Ser Gly Asp Ala Ser Ile His Asp Thr Val Glu
               100                 105                 110

Asn Leu Ile Ile Leu Ala Asn Asn Ser Leu Ser Ser Asn Gly Asn Val
           115                 120                 125

Thr Glu Ser Gly Cys Lys Glu Cys Glu Glu Leu Glu Glu Lys Asn Ile
       130                 135                 140

Lys Glu Phe Leu Gln Ser Phe Val His Ile Val Gln Met Phe Ile Asn
145                 150                 155                 160

Thr Ser Gly Ser Gly Ala Thr Asn Phe Ser Leu Leu Lys Gln Ala Gly
               165                 170                 175

Asp Val Glu Glu Asn Pro Gly Pro Met Trp Leu Gln Ser Leu Leu Leu
           180                 185                 190

Leu Gly Thr Val Ala Cys Ser Ile Ser Ala Pro Ala Arg Ser Pro Ser
       195                 200                 205

Pro Ser Thr Gln Pro Trp Glu His Val Asn Ala Ile Gln Glu Ala Arg
   210                 215                 220
```

```
Arg Leu Leu Asn Leu Ser Arg Asp Thr Ala Ala Glu Met Asn Glu Thr
225                 230                 235                 240

Val Glu Val Ile Ser Glu Met Phe Asp Leu Gln Glu Pro Thr Cys Leu
            245                 250                 255

Gln Thr Arg Leu Glu Leu Tyr Lys Gln Gly Leu Arg Gly Ser Leu Thr
        260                 265                 270

Lys Leu Lys Gly Pro Leu Thr Met Met Ala Ser His Tyr Lys Gln His
    275                 280                 285

Cys Pro Pro Thr Pro Glu Thr Ser Cys Ala Thr Gln Ile Ile Thr Phe
290                 295                 300

Glu Ser Phe Lys Glu Asn Leu Lys Asp Phe Leu Leu Val Ile Pro Phe
305                 310                 315                 320

Asp Cys Trp Glu Pro Val Gln Glu Gly Ser Gly Ala Thr Asn Phe Ser
            325                 330                 335

Leu Leu Lys Gln Ala Gly Asp Val Glu Glu Asn Pro Gly Pro Asp Ile
        340                 345                 350

Ala Ala Ala Met Phe His Val Ser Phe Arg Tyr Ile Phe Gly Leu Pro
            355                 360                 365

Pro Leu Ile Leu Val Leu Leu Pro Val Ala Ser Ser Asp Cys Asp Ile
    370                 375                 380

Glu Gly Lys Asp Gly Lys Gln Tyr Glu Ser Val Leu Met Val Ser Ile
385                 390                 395                 400

Asp Gln Leu Leu Asp Ser Met Lys Glu Ile Gly Ser Asn Cys Leu Asn
                405                 410                 415

Asn Glu Phe Asn Phe Lys Arg His Ile Cys Asp Ala Asn Lys Glu
            420                 425                 430

Gly Met Phe Leu Phe Arg Ala Ala Arg Lys Leu Arg Gln Phe Leu Lys
            435                 440                 445

Met Asn Ser Thr Gly Asp Phe Asp Leu His Leu Leu Lys Val Ser Glu
    450                 455                 460

Gly Thr Thr Ile Leu Leu Asn Cys Thr Gly Gln Val Lys Gly Arg Lys
465                 470                 475                 480

Pro Ala Ala Leu Gly Glu Ala Gln Pro Thr Lys Ser Leu Glu Glu Asn
                485                 490                 495

Lys Ser Leu Lys Glu Gln Lys Lys Leu Asn Asp Leu Cys Phe Leu Lys
            500                 505                 510

Arg Leu Leu Gln Glu Ile Lys Thr Cys Trp Asn Lys Ile Leu Met Gly
        515                 520                 525

Thr Lys Glu His Gly Ser Gly Ala Thr Asn Phe Ser Leu Leu Lys Gln
    530                 535                 540

Ala Gly Asp Val Glu Glu Asn Pro Gly Pro Met Arg Ser Ser Pro Gly
545                 550                 555                 560

Asn Met Glu Arg Ile Val Ile Cys Leu Met Val Ile Phe Leu Gly Thr
            565                 570                 575

Leu Val His Lys Ser Ser Ser Gln Gly Gln Asp Arg His Met Ile Arg
        580                 585                 590

Met Arg Gln Leu Ile Asp Ile Val Asp Gln Leu Lys Asn Tyr Val Asn
    595                 600                 605

Asp Leu Val Pro Glu Phe Leu Pro Ala Pro Glu Asp Val Glu Thr Asn
            610                 615                 620

Cys Glu Trp Ser Ala Phe Ser Cys Phe Gln Lys Ala Gln Leu Lys Ser
625                 630                 635                 640

Ala Asn Thr Gly Asn Asn Glu Arg Ile Ile Asn Val Ser Ile Lys Lys
```

```
                    645                 650                 655
Leu Lys Arg Lys Pro Ser Thr Asn Ala Gly Arg Arg Gln Lys His
                660                 665                 670

Arg Leu Thr Cys Pro Ser Cys Asp Ser Tyr Glu Lys Lys Pro Pro Lys
                675                 680                 685

Glu Phe Leu Glu Arg Phe Lys Ser Leu Leu Gln Lys Val Ser Thr Leu
    690                 695                 700

Ser Phe Ile Pro Trp Asp Ile Gly Ser Gly Ala Thr Asn Phe Ser Leu
705                 710                 715                 720

Leu Lys Gln Ala Gly Asp Val Glu Glu Asn Pro Gly Pro Glu Phe Glu
                725                 730                 735

Leu Met Val Ser Lys Gly Glu Glu Leu Phe Thr Gly Val Val Pro Ile
                740                 745                 750

Leu Val Glu Leu Asp Gly Asp Val Asn Gly His Lys Phe Ser Val Ser
                755                 760                 765

Gly Glu Gly Glu Gly Asp Ala Thr Tyr Gly Lys Leu Thr Leu Lys Phe
    770                 775                 780

Ile Cys Thr Thr Gly Lys Leu Pro Val Pro Trp Pro Thr Leu Val Thr
785                 790                 795                 800

Thr Leu Thr Tyr Gly Val Gln Cys Phe Ser Arg Tyr Pro Asp His Met
                805                 810                 815

Lys Gln His Asp Phe Phe Lys Ser Ala Met Pro Glu Gly Tyr Val Gln
                820                 825                 830

Glu Arg Thr Ile Phe Phe Lys Asp Asp Gly Asn Tyr Lys Thr Arg Ala
    835                 840                 845

Glu Val Lys Phe Glu Gly Asp Thr Leu Val Asn Arg Ile Glu Leu Lys
850                 855                 860

Gly Ile Asp Phe Lys Glu Asp Gly Asn Ile Leu Gly His Lys Leu Glu
                870                 875                 880
865

Tyr Asn Tyr Asn Ser His Asn Val Tyr Ile Met Ala Asp Lys Gln Lys
                885                 890                 895

Asn Gly Ile Lys Val Asn Phe Lys Ile Arg His Asn Ile Glu Asp Gly
                900                 905                 910

Ser Val Gln Leu Ala Asp His Tyr Gln Gln Asn Thr Pro Ile Gly Asp
    915                 920                 925

Gly Pro Val Leu Leu Pro Asp Asn His Tyr Leu Ser Thr Gln Ser Ala
    930                 935                 940

Leu Ser Lys Asp Pro Asn Glu Lys Arg Asp His Met Val Leu Leu Glu
945                 950                 955                 960

Phe Val Thr Ala Ala Gly Ile Thr Leu Gly Met Asp Glu Leu Tyr Lys
                965                 970                 975

<210> SEQ ID NO 15
<211> LENGTH: 2121
<212> TYPE: DNA
<213> ORGANISM: Artificial Sequence
<220> FEATURE:
<223> OTHER INFORMATION: Synthetic

<400> SEQUENCE: 15
atgagaattt cgaaaccaca tttgagaagt atttccatcc agtgctactt gtgtttactt       60
ctaaacagtc atttctaac tgaagctggc attcatgtct tcattttggg ctgtttcagt       120
gcagggcttc ctaaaacaga agccaactgg gtgaatgtaa taagtgattt gaaaaaaatt      180
gaagatctta ttcaatctat gcatattgat gctactttat atacggaaag tgatgttcac      240
```

```
cccagttgca aagtaacagc aatgaagtgc tttctcttgg agttacaagt tatttcactt      300
gagtccggag atgcaagtat tcatgataca gtagaaaatc tgatcatcct agcaaacaac      360
agtttgtctt ctaatgggaa tgtaacagaa tctggatgca agaatgtga ggaactggag       420 gaaaaaaata ttaaagaatt tttgcagagt tttgtacata ttgtccaaat gttcatcaac      480
acttctggaa gcggagctac taacttcagc ctgctgaagc aggctggaga cgtggaggag      540
aaccctggac ctatgtggct gcagagcctg ctgctcttgg cactgtggc ctgcagcatc       600 tctgcacccg cccgctcgcc cagccccagc acgcagccct gggagcatgt gaatgccatc      660
caggaggccc ggcgtctcct gaacctgagt agagacactg ctgctgagat aatgaaaca       720 gtagaagtca tctcagaaat gttgacctc caggagccga cctgcctaca gacccgcctg       780
gagctgtaca gcagggcct gcggggcagc ctcaccaagc tcaagggccc cttgaccatg       840
atggccagcc actacaagca gcactgccct ccaaccccgg aaacttcctg tgcaacccag      900
attatcacct ttgaaagttt caaagagaac ctgaaggact ttctgcttgt catcccctt       960 gactgctggg agccagtcca ggagggaagc ggagctacta acttcagcct gctgaagcag     1020
gctggagacg tggaggagaa ccctggacct gatatcgcgg ccgcgatgtt ccatgtttct     1080
tttaggtata tctttggact tcctcccctg atccttgttc tgttgccagt agcatcatct     1140
gattgtgata ttgaaggtaa agatggcaaa caatatgaga gtgttctaat ggtcagcatc     1200
gatcaattat tggacagcat gaaagaaatt ggtagcaatt gcctgaataa tgaatttaac     1260
ttttttaaaa gacatatctg tgatgctaat aaggaaggta tgttttatt ccgtgctgct      1320 cgcaagttga ggcaatttct taaaatgaat agcactggtg attttgatct ccacttatta     1380
aaagtttcag aaggcacaac aatactgttg aactgcactg gccaggttaa aggaagaaaa     1440
ccagctgccc tgggtgaagc ccaaccaaca aagagtttgg aagaaaataa atctttaaag     1500
gaacagaaaa aactgaatga cttgtgtttc ctaaagagac tattacaaga gataaaaact     1560
tgttggaata aaattttgat gggcactaaa gaacacggaa gcggagctac taacttcagc     1620
ctgctgaagc aggctggaga cgtggaggag aaccctggac ctatgagatc cagtcctggc     1680
aacatggaga ggattgtcat ctgtctgatg gtcatcttct tggggacact ggtccacaaa     1740
tcaagctccc aaggtcaaga tcgccacatg attagaatgc gtcaacttat agatattgtt     1800
gatcagctga aaaattatgt gaatgacttg gtccctgaat tctgccagc tccagaagat     1860 gtagagacaa actgtgagtg gtcagctttt tcctgctttc agaaggccca actaaagtca     1920
gcaaatacag gaaacaatga aaggataatc aatgtatcaa ttaaaaagct gaagaggaaa     1980
ccaccttcca caaatgcagg gagaagacag aaacacagac taacatgccc ttcatgtgat     2040
tcttatgaga aaaaccacc caagaattc ctagaaagat tcaaatcact tctccaaaag       2100
gtatctacct taagttttcat t                                              2121
```

<210> SEQ ID NO 16
<211> LENGTH: 707
<212> TYPE: PRT
<213> ORGANISM: Artificial Sequence
<220> FEATURE:
<223> OTHER INFORMATION: Synthetic

<400> SEQUENCE: 16

Met Arg Ile Ser Lys Pro His Leu Arg Ser Ile Ser Ile Gln Cys Tyr
1               5                   10                  15

Leu Cys Leu Leu Leu Asn Ser His Phe Leu Thr Glu Ala Gly Ile His

```
                20                  25                  30
Val Phe Ile Leu Gly Cys Phe Ser Ala Gly Leu Pro Lys Thr Glu Ala
            35                  40                  45
Asn Trp Val Asn Val Ile Ser Asp Leu Lys Lys Ile Glu Asp Leu Ile
        50                  55                  60
Gln Ser Met His Ile Asp Ala Thr Leu Tyr Thr Glu Ser Asp Val His
65                  70                  75                  80
Pro Ser Cys Lys Val Thr Ala Met Lys Cys Phe Leu Leu Glu Leu Gln
                85                  90                  95
Val Ile Ser Leu Glu Ser Gly Asp Ala Ser Ile His Asp Thr Val Glu
            100                 105                 110
Asn Leu Ile Ile Leu Ala Asn Asn Ser Leu Ser Ser Asn Gly Asn Val
        115                 120                 125
Thr Glu Ser Gly Cys Lys Glu Cys Glu Glu Leu Glu Glu Lys Asn Ile
    130                 135                 140
Lys Glu Phe Leu Gln Ser Phe Val His Ile Val Gln Met Phe Ile Asn
145                 150                 155                 160
Thr Ser Gly Ser Gly Ala Thr Asn Phe Ser Leu Leu Lys Gln Ala Gly
                165                 170                 175
Asp Val Glu Glu Asn Pro Gly Pro Met Trp Leu Gln Ser Leu Leu Leu
            180                 185                 190
Leu Gly Thr Val Ala Cys Ser Ile Ser Ala Pro Ala Arg Ser Pro Ser
        195                 200                 205
Pro Ser Thr Gln Pro Trp Glu His Val Asn Ala Ile Gln Glu Ala Arg
    210                 215                 220
Arg Leu Leu Asn Leu Ser Arg Asp Thr Ala Ala Glu Met Asn Glu Thr
225                 230                 235                 240
Val Glu Val Ile Ser Glu Met Phe Asp Leu Gln Glu Pro Thr Cys Leu
                245                 250                 255
Gln Thr Arg Leu Glu Leu Tyr Lys Gln Gly Leu Arg Gly Ser Leu Thr
            260                 265                 270
Lys Leu Lys Gly Pro Leu Thr Met Met Ala Ser His Tyr Lys Gln His
        275                 280                 285
Cys Pro Pro Thr Pro Glu Thr Ser Cys Ala Thr Gln Ile Ile Thr Phe
    290                 295                 300
Glu Ser Phe Lys Glu Asn Leu Lys Asp Phe Leu Leu Val Ile Pro Phe
305                 310                 315                 320
Asp Cys Trp Glu Pro Val Gln Glu Gly Ser Gly Ala Thr Asn Phe Ser
                325                 330                 335
Leu Leu Lys Gln Ala Gly Asp Val Glu Glu Asn Pro Gly Pro Asp Ile
            340                 345                 350
Ala Ala Ala Met Phe His Val Ser Phe Arg Tyr Ile Phe Gly Leu Pro
        355                 360                 365
Pro Leu Ile Leu Val Leu Leu Pro Val Ala Ser Ser Asp Cys Asp Ile
    370                 375                 380
Glu Gly Lys Asp Gly Lys Gln Tyr Glu Ser Val Leu Met Val Ser Ile
385                 390                 395                 400
Asp Gln Leu Leu Asp Ser Met Lys Glu Ile Gly Ser Asn Cys Leu Asn
                405                 410                 415
Asn Glu Phe Asn Phe Phe Lys Arg His Ile Cys Asp Ala Asn Lys Glu
            420                 425                 430
Gly Met Phe Leu Phe Arg Ala Ala Arg Lys Leu Arg Gln Phe Leu Lys
        435                 440                 445
```

-continued

```
Met Asn Ser Thr Gly Asp Phe Asp Leu His Leu Leu Lys Val Ser Glu
    450                 455                 460
Gly Thr Thr Ile Leu Leu Asn Cys Thr Gly Gln Val Lys Gly Arg Lys
465                 470                 475                 480
Pro Ala Ala Leu Gly Glu Ala Gln Pro Thr Lys Ser Leu Glu Glu Asn
                485                 490                 495
Lys Ser Leu Lys Glu Gln Lys Lys Leu Asn Asp Leu Cys Phe Leu Lys
                500                 505                 510
Arg Leu Leu Gln Glu Ile Lys Thr Cys Trp Asn Lys Ile Leu Met Gly
            515                 520                 525
Thr Lys Glu His Gly Ser Gly Ala Thr Asn Phe Ser Leu Leu Lys Gln
        530                 535                 540
Ala Gly Asp Val Glu Glu Asn Pro Gly Pro Met Arg Ser Ser Pro Gly
545                 550                 555                 560
Asn Met Glu Arg Ile Val Ile Cys Leu Met Val Ile Phe Leu Gly Thr
                565                 570                 575
Leu Val His Lys Ser Ser Ser Gln Gly Gln Asp Arg His Met Ile Arg
                580                 585                 590
Met Arg Gln Leu Ile Asp Ile Val Asp Gln Leu Lys Asn Tyr Val Asn
            595                 600                 605
Asp Leu Val Pro Glu Phe Leu Pro Ala Pro Glu Asp Val Glu Thr Asn
        610                 615                 620
Cys Glu Trp Ser Ala Phe Ser Cys Phe Gln Lys Ala Gln Leu Lys Ser
625                 630                 635                 640
Ala Asn Thr Gly Asn Asn Glu Arg Ile Ile Asn Val Ser Ile Lys Lys
                645                 650                 655
Leu Lys Arg Lys Pro Pro Ser Thr Asn Ala Gly Arg Arg Gln Lys His
                660                 665                 670
Arg Leu Thr Cys Pro Ser Cys Asp Ser Tyr Glu Lys Lys Pro Pro Lys
            675                 680                 685
Glu Phe Leu Glu Arg Phe Lys Ser Leu Leu Gln Lys Val Ser Thr Leu
        690                 695                 700
Ser Phe Ile
705
```

RECOMBINANT VIRAL VECTOR, IMMUNOGENIC COMPOSITION COMPRISING SAME, AND USES

CROSS-REFERENCE TO RELATED APPLICATIONS

This application is the National Stage of International Application No. PCT/CN2020/075677, filed on Feb. 18, 2020, the content of each of which is incorporated by reference herein.

INCORPORATION-BY-REFERENCE OF MATERIALS FILED ON COMPACT DISC

The present application includes a Sequence Listing which has been submitted in XML format via EFS-Web and is hereby incorporated by reference in its entirety. Said XML copy, created on Mar. 21, 2023_is named PANA 1037US_SL.txt and is 34, kilo bytes in size.

TECHNICAL FIELD

The present invention belongs to the fields of molecular biology and immunology. Specifically, the present invention relates to a recombinant viral vector, an immunogenic composition comprising the same, and uses, and in particular to a recombinant viral vector useful in preparing a tumor vaccine for preventing and/or treating various tumors.

Background Art

With the development of tumor biology and immunology, tumor immunotherapy has made a great progress and gradually become an important development direction of current tumor treatment. Especially with the great success of PD-1/PD-L1 immunotherapy, the development of tumor immunotherapy has become an emerging hot spot in current tumor treatment.

Tumor vaccines kill tumor cells and control the growth of tumor cells by stimulating specific immune responses against tumors in the body and activating and producing immune cells in quantity, thereby achieving the effect of reducing or controlling tumor growth. The development of tumor vaccines is also an important research direction of current tumor immunotherapy.

The studies have shown that cytotoxic (CD8+) and helper (CD4+) T cells play a key role in tumor rejection. Therefore, the goal of most tumor vaccines is an attempt to induce specific T cell responses in cells. During the synthesis of tumor antigens in tumor cells, the decomposed polypeptides are presented to the surfaces of tumor cells through MHC class I molecules to activate CD8+ T cells. MHC class II molecules are recognized by CD4+ T cells, which are mainly located on the surfaces of special antigen-presenting cells (APCs), including dendritic cells, B cells, and macrophages. The exogenous proteins secreted by tumor cells or released by tumor lysis are captured by the APCs. Within the APCs, antigens are processed into polypeptide fragments and presented to CD4+ cells by class II MHC. Activated antigen-specific CD8+ cells eventually become cytotoxic T cells and lyse tumor cells.

An ideal tumor-specific antigen should have a stronger immunogenicity and be expressed by tumor cells, but not expressed in normal cells. Unfortunately, most tumor antigens are not sufficiently immunogenic to induce an effective immune response. Moreover, many tumor antigens are expressed to some extent in normal tissues, thereby leading to the presence of immune tolerance in vivo. Therefore, these tumor antigens naturally have the characteristic of weak immunogenicity. Therefore, a designed tumor vaccine must overcome the immune tolerance barrier in the body and activate the production of an immune response against a tumor antigen.

Tumor vaccines are mainly divided into whole cell vaccines, protein vaccines, polypeptide vaccines, virus vaccines and dendritic cell vaccines. However, DNA vaccines and RNA vaccines actually still fall within the scope of molecular vaccines, and just use different expression systems.

Cell vaccines. In the past, whole cells were used as tumor vaccines since tumor antigens and their clinical relevance were not quite clear, so that those unknown tumor antigens could be provided to activate the immune system. In mouse tumor models, mice are typically immunized with radiation-inactivated tumor cells to protect the mice from the invasion of inoculated tumors. But when use of a tumor cell vaccine is delayed until a week after inoculation with tumor cells, the vaccine loses its ability to protect the mice. Due to poorer clinical treatment response, tumor cell vaccines are only suitable for the prevention of recurrence of tumor patients without special tumor antigens. Good results are rarely obtained in clinical studies for the patients in advanced stage. In recent years, due to the progress in identification and analysis of tumor antigens, especially in-depth understanding of the mechanism by which T cells recognize antigens, tumor antigen vaccines have basically replaced cell vaccines for tumor immunotherapy.

Polypeptide and protein vaccines. Antigenic polypeptide epitopes on the surfaces of MHC molecules, which are recognized by T cells, generally consist of 7-12 amino acids. Therefore, an antigenic polypeptide may be mixed with an immune adjuvant and used to achieve the purpose of being loaded into empty MHC molecules in vivo. To date, almost all polypeptide-based vaccines are MHC class I antigen-restricted peptides. There are some limitations to the application of polypeptide vaccines. The applied polypeptide vaccines must be matched with the patient's MHC class I antigen molecules, i.e., so-called individualization. However, due to the different subtypes of MHC class I molecules in different patients and the different sequences of tumor antigen polypeptides used, great difficulty is brought to the clinical application of tumor antigen polypeptides.

Recombinant molecular vaccines. Application of tumor antigen protein vaccines can overcome such difficulty, but use of protein alone cannot activate the body's immune response. Primate experimental studies have demonstrated that the optimal immune efficacy requires cross-linking of a tumor protein with a protein having strong immunogenicity. To induce an effective immune response, a weak antigen must be used in combination with an immune adjuvant to provide a non-specific signal for activating the immune system. Many immune adjuvants have certain toxicity and cannot be used in clinic, so most antigen protein vaccines are presented in the form of a recombinant.

A method to enhance the immunogenicity of a tumor protein by means of recombinant form is to recombine the tumor antigen with a cytokine, such as GM-CSF, interleukin, etc. to form a fusion protein. The recombination of a weak tumor antigen with a bacterial or viral antigen, or toxin such as diphtheria toxin, pseudomonas toxin, etc. can significantly improve the antigenicity of the tumor antigen and promote the phagocytosis and presentation of the tumor antigen by DCs, which has achieved certain effects. However, the method of individual recombination of a tumor antigen and toxin has not achieved desired effect so far.

Dendritic cell vaccines. For an effective T cell-mediated immune response, T cells require antigen presentation and sensitization of naive T cells, and restimulation of sensitized T lymphocytes. To initiate an effective T cell-mediated tumor immunity, tumor antigen polypeptides derived from any part of the body must be recognized by T cells. Therefore, antigen presentation is a critical step in obtaining an effective immune response. Vaccine-stimulated immune responses mainly depend on the initial processing and further presentation of antigens by efficient APCs.

Interleukin 7 (IL-7) is a hematopoietic growth factor secreted by bone marrow and thymic stromal cells. It can also be produced by keratinocytes, dendritic cells, hepatocytes, neuronal cells and epithelial cells, but normal lymphocytes cannot secrete and produce IL-7. IL-7 promotes the differentiation of hematopoietic stem cells into lymphoid precursor cells. It can also stimulate the proliferation of all cells in the lymphatic system, such as B cells, T cells and NK cells. It is essential for the maturation of B cells at a specific stage, as well as the survival, development and balance of T cells and natural killer cells (NK cells).

Interleukin 15 (IL-15) is secreted and produced by mononuclear phagocytes after viral infection. IL-15 has a structure similar to that of interleukin 2 (IL-2), and transmits signals by binding to an IL-2/IL-15 receptor 13 chain (CD122) and shared receptor γ chain (CD132) complex. This cytokine regulates the activation and proliferation of T cells and NK cells. But in the absence of an antigen, IL-15 can provide survival signals that maintain memory T cells. IL-15 has been shown to enhance the antitumor effect of CD8+ T cells in the preclinical studies. IL-15 can also be used as a vaccine adjuvant to increase vaccine immunogenicity.

Interleukin 21 (IL-21) is secreted and produced by activated CD4+ T cells and can have regulating effects on various cells in the immune system. IL-21 can achieve an antitumor effect by consistently increasing CD8+ T cell response (Journal of Immunology. 173(2): 900-9). IL-21 also plays an important role in the control of chronic viral infections. IL-21 can enhance HIV-specific cytotoxic T cell response (Blood. 109(9): 3873-80) and functions of NK cells (Journal of Leukocyte Biology. 87(5): 857-67) in HIV-infected individuals.

Granulocyte-macrophage colony-stimulating factor (GM-CSF), also known as colony-stimulating factor 2 (CSF2), is a monomeric glycoprotein secreted by macrophages, T cells, mast cells, NK cells, endothelial cells and fibroblasts. GM-CSF has a variety of functions, which can stimulate stem cells to produce various granulocytes and monocytes, and rapidly activate and proliferate macrophages in a large number, thereby achieving an anti-infection effect. Oncolytic virotherapy with GM-CSF developed by Amgen has been approved by the FDA for the treatment of melanoma.

Contents of the Invention

Therefore, in order to improve the immunogenicity of tumor antigens, stimulate tumor-specific immune responses and fundamentally cure tumors, in the present invention, a plurality of immune-associated cytokines are jointly expressed in a recombinant virus vector, so as to improve the immune effect of a vaccine and exert the anti-tumor effects of the cytokines.

An object of the present invention is to provide a recombinant viral vector, which can be used for preparing tumor vaccines, thereby preventing and/or treating various tumors.

In one embodiment of the present invention, the recombinant viral vector comprises a polynucleotide encoding cytokine(s).

For the purposes of the invention, the following terms are defined below.

"Cytokine (CK)" refers to a class of small molecule proteins with broad biological activities, that are synthesized and secreted by immune cells (such as monocytes, macrophages, T cells, B cells, and NK cells, etc.) and certain non-immune cells (such as endothelial cells, epidermal cells, and fibroblasts, etc.) upon stimulation. Cytokines generally regulate cell growth, differentiation and effects, and regulate and control immune responses by binding to the corresponding receptors. Cytokines are low molecular weight soluble proteins produced by a variety of cells induced by immunogens, mitogens or other stimulators, and have multiple functions, such as regulating innate and adaptive immunity, hematopoiesis, cell growth and APSC pluripotent cells, and repair of damaged tissues, etc. Cytokines can be divided into interleukins, interferons, tumor necrosis factor superfamily, colony-stimulating factors, chemokines, growth factors, and the like. In an embodiment of the present invention, the cytokine is one or more selected from IL-7, IL-15, IL-21 and GM-CSF. In one embodiment of the present invention, the IL-15 is human IL-15; preferably, the amino acid sequence of the human IL-15 is shown in SEQ ID NO: 2; and preferably, the encoding nucleic acid sequence of the human IL-15 is shown in SEQ ID NO: 1. In one embodiment of the present invention, the GM-CSF is human GM-CSF; preferably, the amino acid sequence of the human GM-CSF is shown in SEQ ID NO: 4; and preferably, the encoding nucleic acid sequence of the human GM-CSF is shown in SEQ ID NO: 3. In one embodiment of the present invention, the IL-7 is human IL-7; preferably, the amino acid sequence of the human IL-7 is shown in SEQ ID NO: 6; and preferably, the encoding nucleic acid sequence of the human IL-7 is shown in SEQ ID NO: 5. In one embodiment of the present invention, the IL-21 is human IL-21; preferably, the amino acid sequence of the human IL-21 is shown in SEQ ID NO: 8; and preferably, the encoding nucleic acid sequence of the human IL-21 is shown in SEQ ID NO: 7. In one embodiment of the present invention, the cytokine comprises human IL-15, human GM-CSF, human IL-7 and human IL-21; preferably, the nucleic acid sequence of the polynucleotide encoding the cytokine is shown in SEQ ID NO: 15; and the amino acid sequence encoded by the polynucleotide is shown in SEQ ID NO: 16.

"Tumor antigen" refers to an antigenic substance that emerges or is overexpressed during the occurrence and development of a tumor. Tumor antigens include, but are not limited to, tumor-specific antigens, tumor-associated antigens, tissue differentiation antigens, proto-oncovirus antigens, cancer-testis antigens (CT antigens), and the like.

"Tumor-specific antigen" (TSA) refers to an antigenic substance that is only expressed in tumor cells and not in normal cells, for example, mutated antigens, especially the mutated products of proto-oncogenes and tumor suppressor genes, including ras, p53 and the like.

"Tumor-associated antigen" (TAA) refer to an antigenic substance that is expressed in tumor cells and some normal cells.

Preferably, the viral vector is a vaccinia virus vector, preferably a replicative vaccinia virus vector, such as a vaccinia virus Tiantan strain, e.g., Strain 752-1, or a non-replicating vaccinia virus vector, such as vaccinia virus modified vaccinia Ankara (MVA).

Another object of the present invention is to provide an immunogenic composition, comprising a prophylactically and/or therapeutically effective amount of the recombinant viral vector according to the present invention, and a pharmaceutically acceptable carrier.

Another object of the present invention is to provide a tumor vaccine, comprising a prophylactically and/or therapeutically effective amount of the recombinant viral vector according to the present invention, and a pharmaceutically acceptable carrier.

Another object of the present invention is to provide a kit comprising the recombinant viral vector, the immunogenic composition, or the tumor vaccine according to the present invention, and the instructions for use thereof.

The present invention also provides use of the recombinant viral vector, the immunogenic composition, or the tumor vaccine according to the present invention in preparing a medicament or vaccine for treating and/or preventing a tumor. Preferably, the tumor is a malignant tumor. More preferably, the malignant tumor is breast cancer or colon cancer.

The present invention further provides a method for treating and/or preventing a tumor, comprising administrating a prophylactically and/or therapeutically effective amount of the recombinant viral vector, the immunogenic composition, or the tumor vaccine according to the present invention to a subject in need thereof; preferably, the tumor is a malignant tumor; and more preferably, the malignant tumor is breast cancer or colon cancer.

The recombinant viral vector provided by the present invention can stimulate tumor-specific immune responses, effectively inhibit the growth of tumor cells, and prolong the survival time of tumor patients.

BRIEF DESCRIPTION OF THE DRAWINGS

The embodiments of the present invention will be described in detail below in conjunction with the accompanying drawings, in which:

FIG. 3 is the detection results of the activity of human GM-CSF in Example 5.

FIG. 4 is the detection results of the activity of human IL-21 in Example 6.

BEST MODES FOR CARRYING OUT THE INVENTION

The present invention will be further described below in conjunction with the examples, and it should be understood that the examples are only used to further illustrate and set forth the present invention, and not intended to limit the present invention.

Unless otherwise defined, all technical and scientific terms in the present description have the same meanings as commonly understood by those skilled in the art. Although methods and materials similar or identical to those described herein can be used in the experiments or practical applications, the materials and methods are described hereinafter. If contradicted mutually, the definitions contained in the present description shall prevail. In addition, the materials, methods and examples are illustrative only and not limiting.

Example 1 Construction of Shuttle Vector pSC65CY

Figure 1:
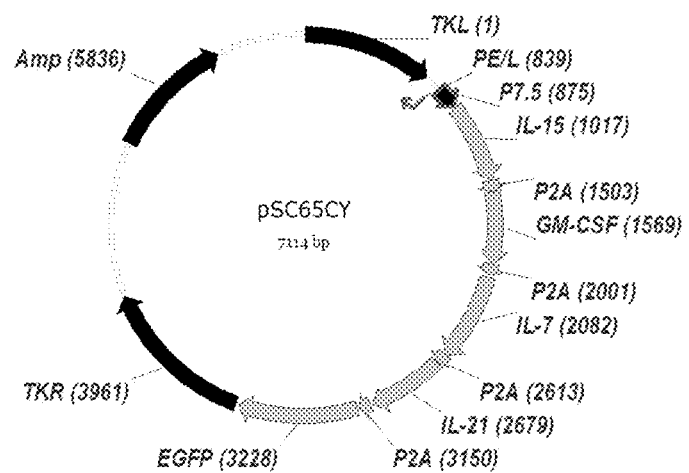
FIG. 1 and FIG. 2 are a plasmid map and a double digestion identification map of shuttle plasmid vector pSC65CY with the cytokine encoding sequence, respectively.
Figure 2:
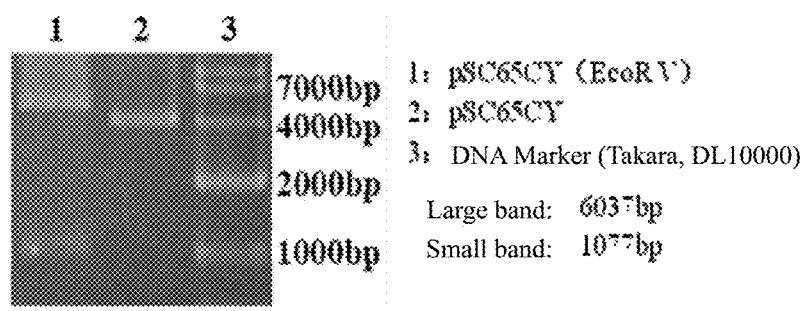

All the amino acid sequences and nucleic acid sequences thereof for human cytokines were obtained from the NCBI database. The sequences of human cytokine IL-15 (NM_000585.4, the nucleic acid sequence is shown in SEQ ID NO: 1, and the amino acid sequence is shown in SEQ ID NO: 2), GM-CSF (NM_000758.3, the nucleic acid sequence is shown in SEQ ID NO: 3, and the amino acid sequence is shown in SEQ ID NO. 4), IL-7 (NM_000880.3, the nucleic acid sequence is shown in SEQ ID NO: 5, and the amino acid sequence is shown in SEQ ID NO: 6), IL-21 (NM_001207006.2, the nucleic acid sequence is shown in SEQ ID NO: 7, and the amino acid sequence is shown in SEQ ID NO: 8) were linked in tandem after the terminator codons were removed. The nucleic acid sequences of the respective cytokines were spaced by P2A nucleic acid sequence which is well known to those of ordinary skill in the art (the nucleic acid sequence is shown in SEQ ID NO: 9, the amino acid sequence is shown in SEQ ID NO: 10, and this endogenous proteinic cleavage site can result in effective cleavage of the fusion protein to form active monomeric cytokines (see Reference Kim J H, Lee S-R, Li L-H, Park H-J, Park J-H, et al., (2011) High Cleavage Efficiency of a 2A Peptide Derived from Porcine Teschovirus-1 in Human Cell Lines, Zebrafish and Mice. PLoS ONE 6(4): e18556.), and finally linked in tandem to a nucleic acid sequence for expression of green fluorescent protein EGFP (the nucleic acid sequence is shown in SEQ ID NO: 11, and the amino acid sequence is shown in SEQ ID NO: 12) which is well known to those of ordinary skill in the art for screening by marker. Finally, a quadruplet nucleic acid sequence for cytokine expression CY was formed (the nucleic acid sequence is shown in SEQ ID NO: 13, and the amino acid sequence is shown in SEQ ID NO: 14). This sequence was synthesized by Suzhou GENEWIZ Co., Ltd., and then inserted between restriction sites Xho I and Bam HI in shuttle vector pSC65 (addgene, Cat. No.: 30327) by molecular cloning technology to construct shuttle vector pSC65CY that can express 4 cytokines (the plasmid map is shown in FIG. 1), and identified by sequencing for confirmation and warehoused. Restriction endonuclease EcoR V was used to identify vector pSC65CY (the enzyme digestion system is shown in Table 1), and its enzyme digestion identification map is shown in FIG. 2.

TABLE 1

| Enzyme digestion identification system for plasmid pSC65CY (enzyme digestion at 37° C. for 2 hours) | |
|---|---|
| Enzyme digestion system | Volume |
| Plasmid pSC65CY | 3 μL, about 1 μg |
| EcoRV (Takara, Cat. No.: 1068A) | 1 μL |
| Enzyme digestion buffer | 1 μL |
| ddH$_2$O | q.s. 10 μL |

Example 2 Construction of Recombinant Vaccinia Virus Vector rvv-CY

The recombinant vaccinia virus vector was obtained in 143B cells, and the specific method was as follows. On Day 1, 143B cells (ATCC® CRL-8303) were plated in a 6-well cell culture plate (JET, TCP-010-006) at 1×10$^6$/well, and incubated overnight at 37° C. in a carbon dioxide cell incubator. On Day 2, vaccinia virus wild strain 752-1 (provided by Beijing Institute of Biological Products Co., Ltd.) was added at 0.05 MOI (i.e., $5 \times 10^4$ PFU (plaque-forming units)/well), and then placed and incubated in the carbon dioxide cell incubator at 37° C. for two hours, during which a shuttle vector/transfection reagent complex was prepared, wherein the shuttle vector was pSC65CY obtained in Example 1, and the transfection reagent is Turbofect (Thermo Fisher Scientific, R0531). The dose of the transfection reagent and compounding method can be found in the instructions of the transfection reagent. After the complex system was completed, the 143B cell supernatant was replaced with a DMEM maintenance medium containing 2% fetal bovine serum (FBS) at 2 mL/well, and then the shuttle vector/transfection reagent complex was added. 48 hours after the transfection, the supernatant was removed, the cells were collected and resuspended in 0.5 mL of maintenance medium, freeze-thawed repeatedly three times, and then the lysate of the recombinant cells was added to new 143B cells (containing 50 μg/mL BrdU) and incubated at 37° C. for 1 to 2 days. Cell lesions were observed during this period, and when an appropriate number of viral plaques appeared (less than 20 plaques/well), purification of single plaque was performed.

Purification of Single Plaque:

Viral plaques emitting green fluorescence were observed under a fluorescence microscope and labeled.

The supernatant was removed, and a plurality of well-dispersed green fluorescent plaques were picked up from each well and transferred to Ep tubes containing 0.5 mL of maintenance medium, respectively.

The Ep tubes containing the virus were shaken for uniform mixing, freeze-thawed repeatedly three times (about 5 minutes in a −80° C. refrigerator, and about 2 minutes at room temperature), finally shaken for uniform mixing, and then stored at −80° C.

At least six rounds of purification of single plaque were repeated until the purity reached 100%.

Example 3 Amplification Preparation and Titration of Recombinant Vaccinia Virus Vector rvv-CY The recombinant vaccinia virus vector rvv-CY constructed in Example 2 and vaccinia virus wild strain (rvv-WT) were amplified in Vero cells (ATCC® CCL-81) respectively, and the amplification method was as follows:

On the previous day, Vero monolayer cells at a confluence of 100% were prepared ($1 \times 10^7$ cells/dish), for a total of 10 dishes.

The supernatant was removed and replaced with a maintenance medium, the vaccinia virus to be amplified was inoculated into the cells (0.01 PFU/cell) and incubated in an incubator at 37° C. for 2-3 days, and obvious cell lesions were observed.

The cells were scraped off and collected, and centrifuged at 1,800 g for 5 minutes, and the supernatant was removed.

The cells were resuspended with 5 mL of maintenance medium, and sonicated on ice with an ultrasonic cell disruptor with 50 watts and 5 sec sonication/5 sec interval, for a total of 15 minutes.

The resultant was freeze-thawed repeatedly two times (about 5 minutes in a −80° C. refrigerator, and about 2 minutes at room temperature), and finally shaken for uniform mixing.

Subpackage into 1.5 mL centrifuge tubes was performed in a Biological Safety Level 2 cabinet, 1 mL/tube, and the centrifuge tubes were cryopreserved at −80° C.

The vaccinia virus prepared by amplification was titrated on Vero cells for determining infectious titer. The specific method was as follows:

On the previous day, Vero cells at a confluence of 100% were prepared in a 24-well plate, $3 \times 10^5$ cells/well.

The supernatant is removed, and 200 μL of maintenance medium was added to each well to prevent the cells from drying out.

100 μL of vaccinia virus to be tested was taken and added with 900 μL of maintenance medium, subject to a tenfold dilution, i.e., a serial dilution by $10^2$, $10^2$, $10^3$, . . . until $10^9$ times. Note: considering the dilution was carried out from higher concentrations to lower concentrations, the pipette tip should be replaced before each dilution to a lower concentration.

The virus was added to the 24-well plate in the order of from higher concentrations to lower concentrations ($10^9$, $10^8$, . . . $10^4$), with 400 μL of dilution solution per well and two replicates, and determination was carried out continuously for 6 dilution ratios. After the addition was completed, the 24-well plate was placed and incubated in a cell incubator at 37° C. for 2 days.

The number of viral plaques was counted under a microscope, and recorded as 20+ if it was more than 20. The average counting of two duplicate wells with a plaque number within 20 (including 20)×2.5 (1000 μL/400 μL)×the dilution ratio of the corresponding well was calculated as the recombinant virus titer (PFU/mL).

The titration results of the vaccinia virus vector titers are shown in Table 2.

TABLE 2

Titration of vaccinia virus vector titers

| Vaccinia virus | Titer (PFU/mL) |
| --- | --- |
| Vaccinia virus wild type rvv-wt | $1.5 \times 10^8$ |
| Recombinant vaccinia virus rvv-CY | $1.0 \times 10^8$ |

Example 4 Detection of Cytokine Expression

The supernatants of vero cells infected with vaccinia virus wild-type rvv-wt and recombinant vaccinia virus rvv-CY respectively were obtained from Example 3, and the contents of cytokines in the infected supernatants were detected by ELISA methods. The ELISA kits for the detection of human IL-7 (Cat. No.: SEK11821), human IL-15 (Cat. No.: SEK10360), and human GM-CSF (Cat. No.: SEK10015) were purchased from Beijing Sino Biological. The ELISA kit for the detection of human IL-21 (Cat. No.: 88-8218) was purchased from Thermo Fisher Scientific. Reference was made to the kit instructions for the detection methods. The contents of various cytokines measured in the virus-infected supernatants are shown in Table 3. The results show that there was no cytokine expression in the supernatant infected with vaccinia virus wild-type rvv-wt, and the detection was less than the detection limit (<0.01 ng/mL). The expression of various cytokines could be detected for the prepared recombinant vaccinia virus rvv-CY having the cytokine nucleic acid sequence, wherein the secretion of human GM-CSF was the strongest, reaching a level of 144.6 ng/mL, while the secretions of the remaining cytokines were comparable, ranging from 1-6 ng/mL.

TABLE 3

Detection of cytokine contents (ng/mL)

| Sample | Human IL-7 | Human IL-15 | Human GM-CSF | Human IL-21 |
|---|---|---|---|---|
| rvv-WT infected supernatant | <0.01 | <0.01 | <0.01 | <0.01 |
| rvv-CY infected supernatant | 3.7 | 1.9 | 144.6 | 5.7 |

Example 5 Detection of Cytokine Human GM-CSF Activity

TF-1 cells (ATCC® CRL-2003) were cultured in a complete RPMI-1640 medium (10% fetal bovine serum (FBS), 1% penicillin-streptomycin (PS), 2 ng/mL human IL-3) to a log phase, and 125 g of culture was centrifuged for 10 minutes to collect the cells; the cells were resuspended in a serum-free RPMI-1640 medium, and centrifuged again to collect the cells. The cells were diluted to $1\times10^5$ cells/mL with a complete RPMI-1640 medium, mixed uniformly, and added to a 96-well plate at 100 µl per well ($1\times10^4$ cells).

A human GM-CSF standard (Novoprotein, Cat. No.: CC79) was diluted stepwise by a two-fold gradient, added to a 96-well plate from lower concentrations to higher concentrations respectively, and used as blank controls, with two duplicate wells for each concentration, a total of 12 gradients. The plate was placed and cultured in a 37° C., 5% $CO_2$ incubator for 96 hours.

Then, 10 microliters of CCK-8 (MCE, Cat. No.: HY-K0301) reagent was added to each well of the 96-well plate, which was put back in the incubator and continuously cultured for 2-4 hours, and OD450 was measured with a microplate reader.

Figures 3, 4:
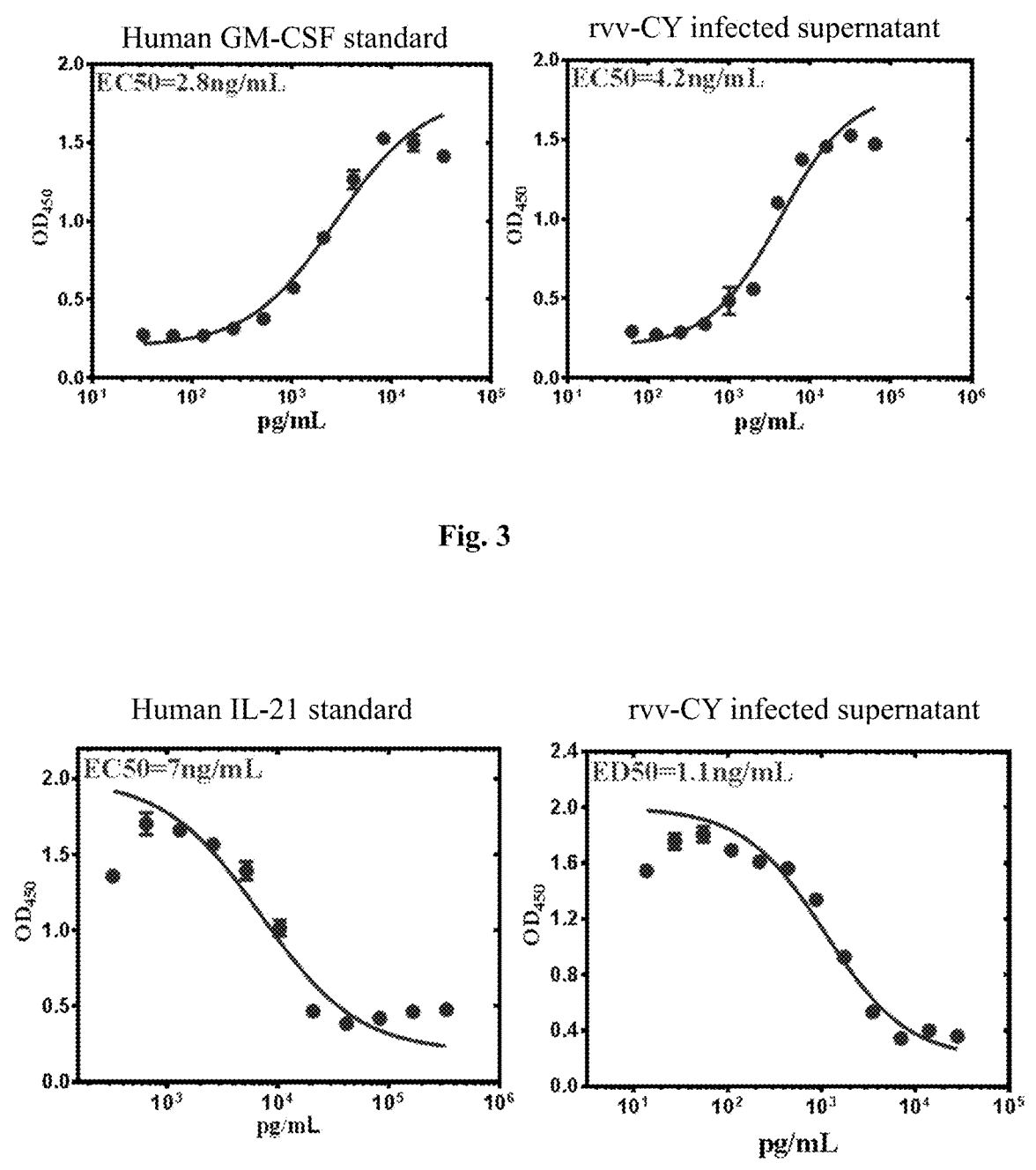

The test results are shown in FIG. 3. The human GM-CSF secreted in the supernatant infected with the recombinant vaccinia virus rvv-CY having the cytokine nucleic acid sequence prepared in Example 3 had the activity (the half effective concentration ($EC_{50}$) is 4.2 ng/mL), which was comparable to that the human GM-CSF standard ($EC_{50}$ is 2.8 ng/mL).

Example 6 Detection of Cytokine Human IL-21 Activity

Mino cells (ATCC® CRL-3000) were cultured in a complete RPMI-1640 medium (10% fetal bovine serum (FBS), 1% penicillin-streptomycin (PS)) to a log phase, and 125 g of culture was centrifuged to collect the cells, and diluted to $2\times10^5$/mL by the complete medium.

A human IL-21 standard (Beijing Sino Biological, Cat. No.: 10584-HNAE) was diluted stepwise in a 96-well plate by a two-fold gradient, and used as blank controls, a total of 12 gradients, 100 microliters per well; after the dilution was completed, 50 microliters of uniformly mixed cells ($1\times10^4$ cells) were added, a total of 150 microliters of liquid per well; and the 96-well plate was placed and cultured in a 37° C., 5% $CO_2$ incubator for 6-7 days.

10 microliters of CCK-8 reagent (MCE, Cat. No.: HY-K0301) was added to each well of the 96-well plate after the culture, the 96-well plate was put back into the incubator for a continued culture of 4-8 hours (the time was determined according to color change), and OD450 was measured with a microplate reader.

The test results are shown in FIG. 4. The human IL-21 secreted in the supernatant infected with the recombinant vaccinia virus rvv-CY having the cytokine nucleic acid sequence prepared in Example 3 had the activity ($EC_{50}$ is 1.1 ng/mL), which was comparable to that of the human IL-21 standard ($EC_{50}$ is 7 ng/mL).

The results of Example 5 and Example 6 show that the prepared recombinant vaccinia virus rvv-CY having the cytokine nucleic acid sequences can correctly express biologically active cytokines.

Example 7 Tumor Treatment Experiment 20 female BAL B/c mice aged 6-8 weeks were purchased from the Animal Experiment Center of Soochow University and feeded in the SPF grade animal room of the Animal Experiment Center of Soochow University. On Day 0, all mice were subcutaneously inoculated with tumor cells CT26 (ATCC® CRL-2638) at a dose of $1\times10^5$ cells/mouse, and then randomly divided into two groups. On Day 1, Day 14 and Day 28 after the tumor cell inoculation, the mice were inoculated with the recombinant virus vector rvv-CY prepared in Example 3 or wild strain rvv-WT of vaccinia virus vector as a control, respectively. Correspondingly, on Day 1, Day 14 and Day 28 after the tumor cell inoculation, the mice of the vaccinia group were inoculated with the vaccinia virus vector prepared in Example 3 at the tibialis anterior muscle of lower leg (see Table 4 for the specific vaccination plan). The tumor growth was observed and measured continuously after the inoculation. The tumor volume was calculated according to the following formula:

$$\text{Tumor volume (mm}^3\text{)} = \text{length} \times \text{width}^2/2.$$

The mice were sacrificed when the tumor volume exceeded 2000 $mm^3$.

TABLE 4

Grouping of experimental animals and vaccination plan

| | Day 1 | | Day 14 | | Day 28 | |
|---|---|---|---|---|---|---|
| Grouping | Vaccine | Dose | Vaccine | Dose | Vaccine | Dose |
| Control group (n = 10) | rvv-WT | $2 \times 10^6$ PFU | LMNB/IFA | $2 \times 10^6$ PFU | LMNB/CFA | $2 \times 10^6$ PFU |
| Treatment group (n = 10) | rvv-CY | $2 \times 10^6$ PFU | rvv-CY | $2 \times 10^6$ PFU | rvv-CY | $2 \times 10^6$ PFU |

The overall survival time of mice in the group treated by the vaccinia virus vector vaccine rvv-CY was significantly better than that of the mice in the control group. The results show that the vaccinia virus vector vaccine rvv-CY can improve the survival of mice with expressed tumors.

Although the present invention has been described to a certain extent, it will be apparent that suitable changes may be made to various conditions without departing from the spirit and scope of the present invention. It may be understood that the present invention is not limited to the embodiments described, but depends on the scope of the claims which include the equivalents for each of the elements described.

The invention claimed is:

1. A recombinant viral vector, comprising a polynucleotide encoding cytokines, wherein the cytokines are human IL-7, human IL-15, human IL-21 and human GM-CSF; wherein the encoding nucleic acid sequence of the human IL-15 is shown in SEQ ID NO: 1; the encoding nucleic acid sequence of the human GM-CSF is shown in SEQ ID NO: 3; the encoding nucleic acid sequence of the human IL-7 is shown in SEQ ID NO: 5; and the encoding nucleic acid sequence of the human IL-21 is shown in SEQ ID NO: 7.

2. The recombinant viral vector according to claim 1, wherein the amino acid sequence of the human IL-15 is shown in SEQ ID NO: 2.

3. The recombinant viral vector according to claim 1, wherein the amino acid sequence of the human GM-CSF is shown in SEQ ID NO: 4.

4. The recombinant viral vector according to claim 1, wherein the amino acid sequence of the human IL-7 is shown in SEQ ID NO: 6.

5. The recombinant viral vector according to claim 1, wherein the amino acid sequence of the human IL-21 is shown in SEQ ID NO: 8.

6. The recombinant viral vector according to claim 1 any one of claim 1, wherein the nucleic acid sequence of the polynucleotide encoding the cytokines is shown in SEQ ID NO: 15; and an amino acid sequence encoded by the polynucleotide is shown in SEQ ID NO: 16.

7. The recombinant viral vector according to claim 1, wherein the viral vector is a vaccinia virus vector, a replicative vaccinia virus vector, vaccinia virus Tiantan strain, 752-1 strain; or a non-replicating vaccinia virus vector, or vaccinia virus modified vaccinia Ankara (MVA).

8. An immunogenic composition, comprising the recombinant viral vector according to claim 1, and a pharmaceutically acceptable carrier.

9. A kit comprising the recombinant viral vector according to claim 1, and instructions for use thereof.

* * * * *